United States Patent [19]

Bradley

[11] Patent Number: 4,993,032
[45] Date of Patent: Feb. 12, 1991

[54] MONOLITHIC TEMPERATURE STABILIZED OPTICAL TUNING CIRCUIT FOR CHANNEL SEPARATION IN WDM SYSTEMS UTILIZING TUNABLE LASERS

[75] Inventor: Eric M. Bradley, San Diego, Calif.

[73] Assignee: General Dynamics Corp., Electronics Divn., San Diego, Calif.

[21] Appl. No.: 458,134

[22] Filed: Dec. 28, 1989

[51] Int. Cl.[5] .............................................. H01S 3/10
[52] U.S. Cl. .................................. 372/20; 350/96.14; 372/32
[58] Field of Search ...................... 372/29, 32, 20, 34, 372/36; 350/96.11, 96.12, 96.14

[56] References Cited

U.S. PATENT DOCUMENTS

| | | | |
|---|---|---|---|
| 4,027,946 | 6/1977 | Tsai | 350/96 WG |
| 4,253,060 | 2/1981 | Chen | 324/72 K |
| 4,297,704 | 10/1981 | Maron et al. | 343/113 R |
| 4,440,468 | 4/1984 | Auracher et al. | 350/96.12 |
| 4,453,801 | 6/1984 | Verber et al. | 50/96.11 |
| 4,468,084 | 8/1984 | Hutcheson et al. | 350/96.11 |
| 4,548,464 | 10/1985 | Auracher et al. | 350/96.14 |
| 4,641,913 | 2/1987 | Nishiwaki et al. | 350/96.11 |
| 4,705,346 | 11/1987 | Miyawaki | 350/96.14 |
| 4,815,081 | 3/1989 | Mahlein et al. | 372/29 |

OTHER PUBLICATIONS

Larry A. Goldren et al., "Continuously-Tunable Single-Frequency Semiconductor Lasers", *IEEE Journal of Quantum Electronics*, vol. QE-23, No. 6, Jun. 1987, pp. 903-908.

*Primary Examiner*—James W. Davie
*Attorney, Agent, or Firm*—Brown, Martin, Haller & McClain

[57] ABSTRACT

The feedback control loop for temperature stabilization of a tunable diode laser consists of a series of lenses or gratings and a detector array disposed in the optical path. The lenses or gratings of the feedback loop are formed in a planar optical waveguide which is temperature stabilized, being fabricated from a plurality of dielectric materials which have approximately equal and opposite changes in refractive index with temperature. Light from a tunable diode laser is input into the loop and is collimated, deflected, and focused onto a portion of the detector array depending on the wavelength of the light. Each detector within the array corresponds to a given wavelength. The detector converts the detected wavelength into an electrical signal which is fed back to the laser phase control to provide tuning to the desired channel.

16 Claims, 1 Drawing Sheet

MONOLITHIC TEMPERATURE STABILIZED OPTICAL TUNING CIRCUIT FOR CHANNEL SEPARATION IN WDM SYSTEMS UTILIZING TUNABLE LASERS

FIELD OF THE INVENTION

The present invention relates to feedback loops for tunable diode lasers. More particularly, it relates to temperature stabilized feedback loops for tunable diode lasers.

BACKGROUND OF THE INVENTION

In order to handle increasing demands for high data rate communications, fiber optic databus systems require the ability to multiplex wavelengths. Wavelength division multiplexing (WDM) is considered to be a promising technique to enhance the transmission capacity of an optical fiber communication system. The range in which wavelengths can be multiplexed, is limited by the luminescence spectrum of semiconductor diode lasers, which has a useful bandwidth of only 200 to 300 Å. In order to propagate the greatest number of channels within this narrow spectrum, the wavelengths must be very stable and tightly controlled.

The best wavelength stabilized diode lasers available today are the distributed feedback laser (DFB) and the distributed Bragg reflector laser (DBR). The range of operating temperatures over which all diode lasers are normally operated is about 20° C. to 70° C. The variation in wavelength is about 5 Å/°C. for laser diodes with conventional cavities, and about 1 Å/°C. for DFB or DBR lasers. Therefore, the wavelength will drift about 50 Å over the required temperature range for even the best stabilized lasers, using up to ¼ of the entire useful bandwidth for only one channel.

Lasers which incorporate Bragg reflectors are subject to wavelength variations due to changes in refractive index, according to the relationship $\lambda_{peak}=2\Lambda n_{eff}$, where $\lambda_{peak}$ is the peak wavelength of the grating, $\Lambda$ is the spacing of the grating and $n_{eff}$ is the effective refractive index of the waveguide in which the grating is formed. The amount of change in refractive index with temperature is known as the index-temperature coefficient.

Temperature stabilization has been proposed by using composite dielectric materials as waveguides and/or end mirrors which have little or no net change in index-temperature coefficient. (See, e.g., Z.H.I. Alferov, et al., IEEE Journal of Quantum Electronics, Vol. QE-23, No. 6, 1987). Additional processing required to fabricate such waveguides leads to possible degradation of the laser facets. A copending application of Bradley describes a device for temperature stabilization of diode lasers which does not require deleterious process steps.

Although a group of such lasers with closely spaced temperature stabilized wavelengths would allow a high-density wavelength division multiplexed (WDM) datalink to be implemented, it would be highly desirable to have a single laser module which can emit any of the required channels, preferably via some convenient electronic tuning mechanism. Tunable diode lasers have been demonstrated, but the number of channels that can be utilized is limited by wavelength drift due to temperature induced changes, the same problems that affects DFB and DBR laser stability. This limitation can be overcome by the use of the integrated optic equivalent of a monochrometer. Feedback from a detector at the output of a temperature stabilized monochrometer to the phase control section of a tunable laser would allow tuning of the laser to the desired channel, causing the laser to emit light having the tightly controlled wavelength needed for WDM. It is to this end that the present invention is directed.

BRIEF SUMMARY OF THE INVENTION

It is the object of the present invention to provide a feedback control loop for temperature stabilization of a tunable diode laser. The feedback control loop consists of a series of lenses or gratings and a detector array disposed in the optical path. The lenses or gratings of the feedback loop are formed in a planar optical waveguide which is temperature stabilized, being fabricated from a plurality of dielectric materials which have approximately equal and opposite changes in refractive index with temperature. Light from a tunable diode laser is input into the loop and is collimated, deflected, and focused onto a portion of the detector array depending on the wavelength of the light. Each detector within the array corresponds to a given wavelength. The detector converts the detected wavelength into an electrical signal which is fed back to the laser phase control to provide tuning to the desired channel (appropriate electronic circuitry will be required to determine how to change the current levels in the laser in response to the detected wavelength).

The optical elements and detector of the control loop follow the principles of integrated optical spectrum analyzers described in the prior art (see, e.g., Chen, U.S. Pat. No. 4,253,060). The first lens provides a means of collimating the incoming light. The collimated light then passes through a diffraction grating which deflects the light at an angle proportional to the wavelength of the light. The diffracted light is then focused by a second lens onto a detector within an array of detectors. The first and second lenses used in the prior art have been geodesic, Luneburg or diffraction lenses.

The present invention proposes the use of diffraction gratings or Bragg mirrors as the collimating means and the focusing means. The waveguide in which the lenses, gratings or mirrors are formed is fabricated of multiple dielectric films which have equal and opposite index-temperature coefficients resulting in temperature stabilization of the peak wavelength transmitted by the grating or reflected by the mirror.

The feedback control loop so stabilized permits accurate determination of the wavelength being emitted by the laser. This provides tight control of the laser tuning so that the tunable laser will meet the rigid wavelength requirements of WDM.

A feedback control loop for temperature stabilization of a tunable diode laser comprises a substrate consisting of a laminar body (possibly consisting of ultra-low thermal expansion glass, but other substrates such as silicon may also be useful) onto which is deposited a waveguide extending along a light path. The waveguide consists of a plurality of dielectric layers, a first dielectric layer having a refractive index and a second dielectric layer abutting the first dielectric layer which exhibits a temperature dependent change in refractive index opposite to that of the first layer. A collimating means, a deflecting means adapted to deflect light at a varying angle depending on the wavelength, and a focusing means are formed along the light path in the waveguide. A detector array is disposed at the focal plane of the focusing means. A feedback means is adapted to convert the wavelength detected by the detector array to a signal for tuning the tunable diode laser to the desired wavelength.

DETAILED DESCRIPTION OF THE PREFERRED EMBODIMENTS

Figure 1:
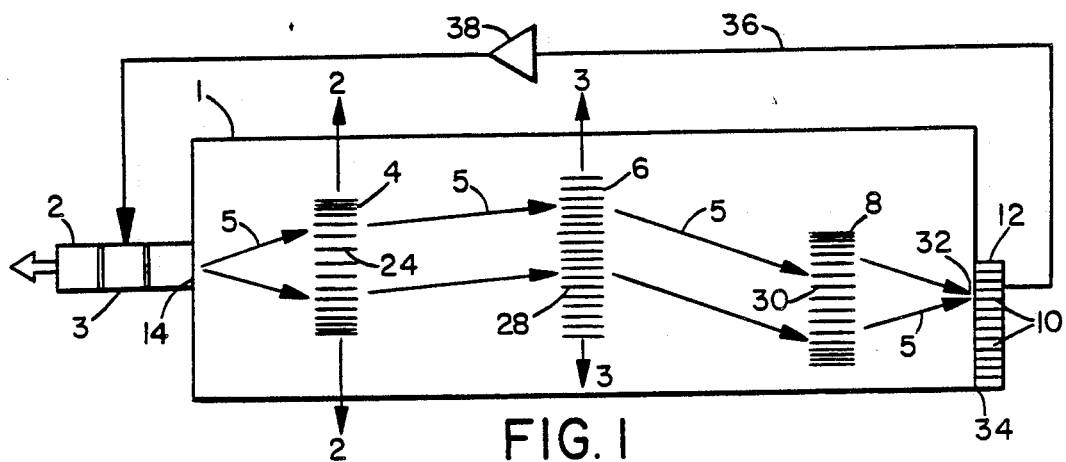
FIG. 1 is a top view of the feedback control loop of the present invention coupled with a tunable diode laser.

The first embodiment of this invention is shown in FIG. 1 which is a view of the top surface of the feedback control loop 1 and the laser 2. Laser 2 is a tunable diode laser with two or three sections, with, for example, one of the sections being the phase control section 3 which allows tuning of the laser to the desired channel. Back facet emission is directed as light path 5 which travels as shown, the light first encountering lens 4, a Bragg grating which has its primary focus at the output of laser 2. The collimated light leaving lens 4 is deflected by grating 6 at an angle depending upon the wavelength of the light. The deflected light enters lens 8, another Bragg grating which focuses the light onto a detector 10 in detector array 12. An electric signal generated by detector 10 is converted into a control signal by operational amplifier 38 and appropriate circuitry. The control signal causes the phase control section 3 (and possibly a tunable Bragg grating section) to shift as needed to tune the laser 2 to its desired wavelength.

Laser 2 may be any tunable diode laser which has a voltage-controlled tuning capability. Laser 2 is butt-joined or otherwise assembled to the optical tuning circuit 1, which is monolithically fabricated An anti-reflective coating deposited at the interface 14 between the laser 2 and the optical tuning circuit 1 may provide more efficient coupling.

Figure 2:
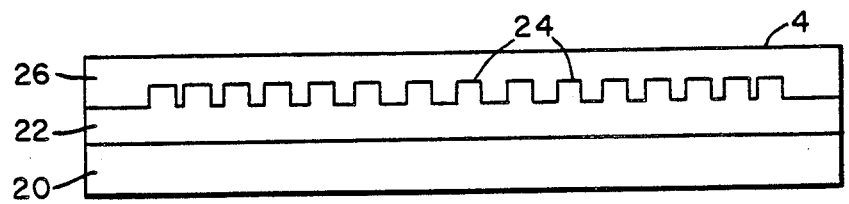
FIG. 2 is a cross-sectional view of the temperature stabilized waveguide with a chirped Bragg lens.
Figure 3:
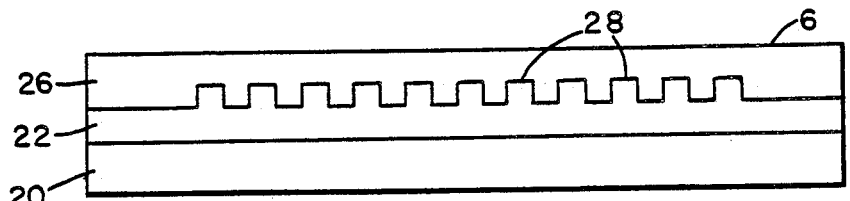
FIG. 3 is a cross-sectional view of the temperature stabilized waveguide with a diffraction grating.

FIG. 2 shows a cross-sectional view of the waveguide into which the optical tuning circuit 1 is formed. Layer 20 may be an ultra-low thermal expansion glass, such as, but not limited to, Corning ULE or Schott Zerodur, on which the waveguide is formed.

The waveguide comprises dielectric layers of different refractive indexes. The first dielectric layer 22 is $SiO_2$, which has a change in refractive index with temperature, or index-temperature coefficient, of approximately $1.0 \times 10^{-5}/°C$. At the locations where gratings are to be formed, lenses 4 and 8, and grating 6, ridges 24 are defined photolithographically or by electron-lithographic techniques into the upper surface of dielectric layer 22. The ridges 24 are etched to a sufficient depth to provide good diffraction efficiency.

The second dielectric layer 26 comprises a material which has an index-temperature coefficient which is approximately equal in magnitude but opposite to the index-temperature coefficient of $SiO_2$. The suggested material for the second dielectric layer 26 is $Ta_2O_5$, however, other materials possessing similar index-temperature coefficients of approximately $-1.2$ to $-1.4 \times 10^{-5}/°C$. are acceptable and fall within the scope of this invention.

Both dielectric layers 22 and 26 may be deposited using ion-assisted deposition (IAD). IAD involves the bombardment of the growing film with ions, so that the columns of atoms which normally form during deposition are broken down. The result is a more nearly amorphous film with high density, high refractive index, and reduced tensile stress as compared with non-ion-deposited films.

An additional means for compensation if a perfect match between index-temperature coefficients for both layers cannot be achieved is by codeposition of composite materials such as $(SiO_2)_x \times (Ta_2O_5)_{1-x}$ in order to raise or lower the index-temperature coefficient of one of the dielectric layers.

Figure 5:
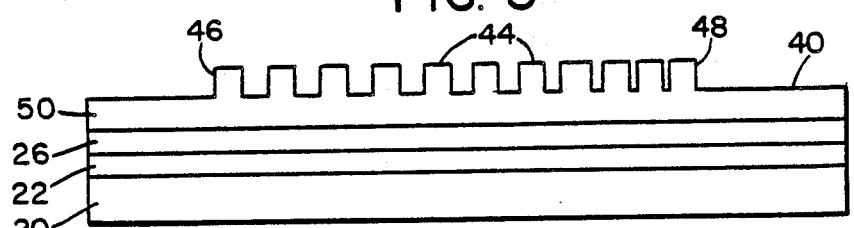
FIG. 5 is a cross-sectional view of an alternate embodiment of the temperature stabilized waveguide with a chirped Bragg mirror.

In an alternate embodiment, shown in FIG. 5, a third dielectric layer 50 may be deposited on top of the second layer 26, layer 50 being $SiO_2$. Any lenses desired to be formed in the waveguide may be formed at the top of layer 50. The interface between layers 22 and 26 serves as the refractive index discontinuity for waveguiding, which is balanced by the equal and opposite index-temperature coefficients. The periodic variation that acts as lenses and gratings is placed at the third layer 50.

Lens 4 is a Bragg grating which is used to collimate the incoming light. Similar integrated optic devices in the past, particularly integrated optic spectrum analyzers, have used primarily geodesic lenses. These lenses present optical alignment difficulty because they involve the positioning of grinding and polishing tools, and because their focusing properties are related to process variations. Lens 4 may be formed in one of two configurations — both of which have been described in the prior art as chirped Bragg gratings. A Bragg grating can efficiently deflect an incident monochromatic optical beam to an angle dictated by the grating periodicity and the angle of incidence. A Bragg grating can function as either a convex or a concave lens depending on how it is chirped. The two configurations of chirping are accomplished by uniform variation of grating periodicity or grating inclination, respectively. In FIGS. 1 and 2, lens 4 is shown with variable grating periodicity, where the widest grating ridge spacing occurs at the center ridge of the lens 4 with uniformly decreasing space between ridges 24 progressing outward to both edges of lens 4.

In the second configuration, a chirped grating is made by progressively increasing the inclination of the grating ridges with respect to the center ridge which is parallel to the light path 5. For a collimating lens, the ridges fan out at the output side of the lens on either side of the center ridge at an angle such that a line drawn back from corresponding ridges toward the light source would converge at the output of the laser 2.

Diffraction grating 6 receives the collimated light output from lens 4 and deflects the light at an angle depending on its wavelength. The deflection efficiency is determined by the grating depth shape, index discontinuity, etc. and the number of grating lines. The periodicity of grating ridges 28 is uniform and the ridges 28 run parallel or slightly off-parallel to the light path 5. Light leaves grating 6 with the same degree of collimation — grating 6 does not perform a focusing function. The light path 5 is merely deflected from its original path.

Lens 8 is a Bragg grating which Fourier transforms and, thus, focuses the deflected light onto a detector 10 in the detector array 12. The multiple possible focal points resulting from the deflection of the range of possible wavelengths make up the focal plane which is focused onto the detector array 12. Lens 8 is a chirped Bragg grating which may be in one of at least two possible configurations, similar to those discussed for lens 4. In FIG. 1, lens 8 is shown with variable grating periodicity where the widest grating ridge spacing occurs at the center ridge with uniformly decreasing space between ridges 30 progressing outward to both edges of lens 8, identical to the configuration shown in FIG. 2.

In the second configuration, a chirped grating is made by progressively increasing the inclination of the grating ridges with respect to the center ridge which is parallel to the light path 5. For a focusing lens, the ridges point inwardly at the output side of the lens on either side of the center ridge at an angle such that a line drawn toward the detector array would converge at the detector array 12. The location of the focal point 32 and the corresponding detector 10 activated by the light will shift according to the angle of deflection caused by grating 6, and where the deflected light entered lens 8 as a result of the deflection.

The detector array 12 is butt-joined or otherwise assembled to the optical tuning circuit 1. An anti-reflective coating may be deposited at the interface 34 between the detector array 12 and the optical tuning circuit 1. Each detector 10 within the array 12 corresponds to a discrete wavelength in increments of 1 Å, to allow accuracy of determination of laser wavelength to 1 Å. In order to accomplish this level of accuracy, the difference between the angle of deflection for different wavelengths must be large enough to separate their focal points by an amount as large as the center-to-center spacing of the detector array 12.

A signal which corresponds to the laser wavelength is produced by the detector array 12 and is carried by connection 36 which includes suitable circuitry 38 for converting the detector output into a signal usable by the phase control section 3. The converted signal induces the phase shift in laser 2 so that the output wavelength is controlled to within the desired tolerance.

Figure 4:
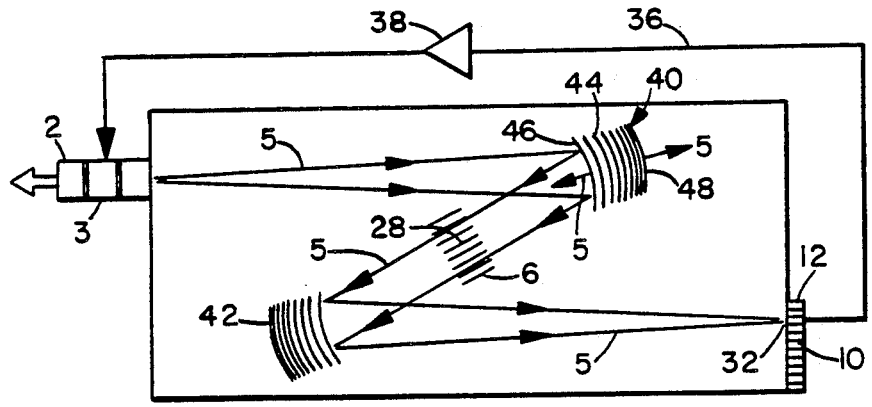
FIG. 4 is a top view of an alternate embodiment with a folded light path.

In an alternate embodiment, shown in FIG. 4, the optical axis is folded allowing a reduced device length. Folding of the optical axis is accomplished by replacing lenses 4 and 8 with curved Bragg mirrors 40 and 42, respectively. The Bragg mirrors are Bragg gratings which are aligned so the ridges are perpendicular to the impinging light. Therefore, Bragg mirrors have the same advantages as Bragg gratings in that they are defined photolithographically, and are much less subject to positioning and alignment problems. The Bragg mirrors are designed as off-axis paraboloids and are chirped. The periodicity of the mirror ridges 44 is uniformly decreasing from the first ridge 46 to the rearmost ridge 48 with respect to the impinging light so that the anticipated range of wavelengths is covered, and separations of the ridges are approximately $\lambda/2$, where $\lambda$ is the wavelength of the light. Light which is not within the range of wavelengths provided for in the chirped Bragg mirrors will not be reflected, but will be transmitted to prevent the light from scattering to positions other than the desired focal point.

The grating 6 is disposed in the same position relative to the light path as in the first embodiment, so that the grating ridges 28 are parallel or slightly off-parallel to the light path.

The detector array 12 is positioned in the focal plane of mirror 42 so that it receives the deflected light the same as in the first embodiment.

The above-described invention provides a means for accurately controlling a tunable diode laser within the tight tolerances required for wavelength division multiplexing. The feedback control loop is fabricated using the most accurate available techniques of photolithography or electronlithography, avoiding the alignment difficulties of commonly used Luneburg and geodesic lenses. The feedback control loop is temperature stabilized, thereby avoiding temperature induced shifts in the diffraction abilities of the gratings, assuring accurate determination of wavelengths which are used to tune the laser output.

It will be evident that there are additional embodiments which are not illustrated above but which are clearly within the scope and spirit of the present invention. The above description and drawings are therefore intended to be exemplary only and the scope of the invention is to be limited solely by the appended claims.

I claim:

1. A feedback control loop for temperature stabilization of a tunable diode laser comprising:
    a substrate comprising a laminar body of ultra-low thermal expansion glass;
    a waveguide extending along a light path comprising a plurality of dielectric layers deposited on said substrate, a first dielectric layer having a refractive index and a second dielectric layer abutting said first dielectric layer which exhibits temperature dependent change in refractive index opposite to that of said first layer, in which is formed along said light path a first lens, a diffraction grating to deflect light at a varying angle depending on a light wavelenqth, and a second lens;
    a detector array disposed in the focal plane of said second lens; and
    a feedback means to convert the wavelength detected by said detector array to a signal for tuning said tunable diode laser to the desired wavelength.

2. A feedback control loop as in claim 1 wherein said first dielectric layer is $SiO_2$ wherein the change in refractive index with temperature is within the range of $1.0 \times 1.0^{-5}/°C$. to $1.5 \times 10^{-5}/°C$.

3. A feedback control loop as in claim 1 wherein said second layer of dielectric material has a change in refractive index with temperature in the range of $-1.0 \times 10^{-5}/°C$. to $-1.5 \times 10^{-5}/°C$.

4. A feedback control loop as in claim 1 wherein said second layer is $Ta_2O_5$.

5. A feedback control loop as in claim 1 wherein said layers comprise composites of low index-temperature coefficient materials.

6. A feedback control loop as in claim 1 wherein said layers are deposited by ion assisted deposition.

7. A feedback control loop as in claim 1 wherein said first lens is a Bragg grating having ridges which are chirped.

8. A feedback control loop as in claim 1 wherein said second lens is a Bragg grating having ridges which are chirped.

9. A feedback control loop as in claim 1 wherein said diffraction grating has uniformly spaced ridges which run parallel to said light path.

10. A feedback control loop as in claim 1 wherein said diffraction grating has uniformly spaced ridges which run slightly off-parallel to said light path.

11. A feedback control loop as in claim 1 wherein said detector array is assembled adjacent to said waveguide and perpendicular to the focal plane of said second lens.

12. A feedback control loop as in claim 1 wherein said detector array comprises a plurality of detectors disposed within said array having one detector corresponding to each wavelength in 1 Å increments.

13. A feedback control loop as in claim 1 wherein said first and second lenses are Bragg mirrors having ridges perpendicular to said light path and causing said light path to be folded.

14. A feedback control loop as in claim 13 wherein said Bragg mirrors are off-axis paraboloids.

15. A feedback control loop as in claim 13 wherein said Bragg mirrors are chirped.

16. A feedback control loop for temperature stabilization of a tunable diode laser comprising:
   a substrate comprising a laminar body of ultra-low thermal expansion glass;
   a temperature stabilized waveguide extending along a light path in which is formed along said light path a first grating to collimate light, a diffraction grating to deflect light at a varying angle depending on the wavelength of light, and a second grating adapted to focus the deflected light;
   a detector array disposed in the focal plane of said second grating; and
   a feedback means to convert the wavelength detected by said detector array to a signal for tuning said tunable diode laser to the desired wavelength.

* * * * *